(12) United States Patent
Yamamoto

(10) Patent No.: US 10,455,748 B2
(45) Date of Patent: Oct. 22, 2019

(54) HIGH-FREQUENCY MODULE

(71) Applicant: Murata Manufacturing Co., Ltd., Kyoto (JP)

(72) Inventor: Issei Yamamoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/817,481

(22) Filed: Nov. 20, 2017

(65) Prior Publication Data
US 2018/0077829 A1    Mar. 15, 2018

Related U.S. Application Data

(63) Continuation of application No. PCT/JP2016/064568, filed on May 17, 2016.

(30) Foreign Application Priority Data

May 20, 2015   (JP) .................................. 2015-102674

(51) Int. Cl.
*H05K 9/00* (2006.01)
*B32B 15/08* (2006.01)
(Continued)

(52) U.S. Cl.
CPC ........... *H05K 9/0088* (2013.01); *B32B 15/08* (2013.01); *C23C 14/185* (2013.01); *H01L 23/00* (2013.01);
(Continued)

(58) Field of Classification Search
CPC ......... H05K 1/0218; H05K 1/141–144; H05K 1/181; H01L 24/20; H01L 24/97; H01L 23/552
(Continued)

(56) References Cited

U.S. PATENT DOCUMENTS 6,838,739 B2 * 1/2005 Stelzl .................... C23C 28/021
257/415
7,187,060 B2 * 3/2007 Usui ................. H01L 23/49822
257/659
(Continued)

FOREIGN PATENT DOCUMENTS

CN         103563493 A    2/2014
JP         H02-60297 U    5/1990
(Continued)

OTHER PUBLICATIONS

International Search Report for PCT/JP2016/064568 dated Feb. 8, 2016.
Written Opinion for PCT/JP2016/064568 dated Feb. 8, 2016.

*Primary Examiner* — Tuan T Dinh
(74) *Attorney, Agent, or Firm* — Pearne & Gordon LLP

(57) ABSTRACT

A high-frequency module includes a wiring board, a component that is mounted on an upper surface of the wiring board, a sealing resin layer that is laminated on the upper surface of the wiring board and that seals the component, a first shield layer that is laminated on the sealing resin layer so as to cover an opposite surface of the sealing resin layer and a peripheral side surface of the sealing resin layer, the opposite surface being opposite to the upper surface of the wiring board, and a second shield layer that is laminated on a portion of the first shield layer that covers the peripheral side surface of the sealing resin layer. In this case, even if the first shield layer cannot be made thick enough for obtaining desired shield characteristics, the second shield layer can provide a thickness corresponding to the insufficient thickness.

7 Claims, 4 Drawing Sheets

(51) Int. Cl.
| | |
|---|---|
| *H01L 23/00* | (2006.01) |
| *H01L 23/28* | (2006.01) |
| *H01L 23/552* | (2006.01) |
| *H01L 25/065* | (2006.01) |
| *C23C 14/18* | (2006.01) |
| *H01L 23/31* | (2006.01) |
| *H05K 1/02* | (2006.01) |
| *H05K 1/18* | (2006.01) |
| *H05K 5/06* | (2006.01) |
| *H01L 21/3205* | (2006.01) |
| *H01L 21/56* | (2006.01) |
| *H05K 3/28* | (2006.01) |

(52) U.S. Cl.
CPC .......... *H01L 23/28* (2013.01); *H01L 23/3121* (2013.01); *H01L 23/552* (2013.01); *H01L 25/0655* (2013.01); *H05K 1/0243* (2013.01); *H05K 1/181* (2013.01); *H05K 5/065* (2013.01); *H05K 9/0022* (2013.01); *B32B 2307/202* (2013.01); *H01L 21/32051* (2013.01); *H01L 21/565* (2013.01); *H01L 25/0652* (2013.01); *H01L 2224/16227* (2013.01); *H01L 2924/10253* (2013.01); *H01L 2924/10329* (2013.01); *H01L 2924/1815* (2013.01); *H01L 2924/19041* (2013.01); *H01L 2924/19042* (2013.01); *H01L 2924/19043* (2013.01); *H01L 2924/19105* (2013.01); *H01L 2924/3025* (2013.01); *H01L 2924/3512* (2013.01); *H05K 3/284* (2013.01); *H05K 2201/10522* (2013.01); *H05K 2201/10545* (2013.01); *H05K 2203/1316* (2013.01); *H05K 2203/1327* (2013.01)

(58) Field of Classification Search
USPC ............. 361/760–764, 816, 818; 174/50–51, 174/520–523; 257/659–660, 700–704
See application file for complete search history.

(56) References Cited

U.S. PATENT DOCUMENTS

| | | | | |
|---|---|---|---|---|
| 8,664,751 | B2* | 3/2014 | Kim | ...................... H01L 23/552 |
| | | | | 257/659 |
| 8,813,354 | B2* | 8/2014 | Wu | ........................ H01L 23/552 |
| | | | | 29/830 |
| 9,007,273 | B2* | 4/2015 | Liao | ...................... H01L 23/481 |
| | | | | 343/841 |
| 9,269,673 | B1* | 2/2016 | Lin | .......................... H01L 24/97 |
| 2006/0272857 | A1* | 12/2006 | Arnold | ................. H05K 9/0024 |
| | | | | 174/377 |
| 2012/0168214 | A1 | 7/2012 | Kashiwagi | |
| 2012/0320558 | A1* | 12/2012 | Foster | ................. H05K 1/0218 |
| | | | | 361/818 |
| 2015/0061095 | A1* | 3/2015 | Choi | ....................... H01L 24/20 |
| | | | | 257/675 |

FOREIGN PATENT DOCUMENTS

| | | |
|---|---|---|
| JP | 2005-276980 A | 10/2005 |
| JP | 2006-019342 A | 1/2006 |
| JP | 2007-243122 A | 9/2007 |
| JP | 2011-159786 A | 8/2011 |

* cited by examiner

-- PRIOR ART --

HIGH-FREQUENCY MODULE

This application is a continuation of International Application No. PCT/JP2016/064568 filed on May 17, 2016 which claims priority from Japanese Patent Application No. 2015-102674 filed on May 20, 2015. The contents of these applications are incorporated herein by reference in their entireties.

BACKGROUND OF THE DISCLOSURE

Field of the Disclosure

The present disclosure relates to a module including a sealing resin layer that covers a component mounted on a wiring board and a shield layer that is laminated on the sealing resin layer.

Description of the Related Art

A high-frequency module that is installed in, for example, a portable terminal device may include a shield layer for intercepting electromagnetic waves. Some high-frequency modules of this type have a structure in which a component mounted on a wiring board is covered by a mold resin and the shield layer is provided so as to cover a surface of the mold resin. In order to intercept electromagnetic waves, the shield layer generally includes a conductive film, such as a Cu film, an Al film, or an Ag film. However, such metal films have low adhesive strength with respect to the mold resin, and do not provide sufficient anti-corrosiveness.

Hitherto, a shield layer having high adhesiveness and high anti-corrosiveness has been proposed. For example, as shown in FIG. 7, a high-frequency module 100 described in Patent Document 1 includes a resin substrate 101 and a shield layer 102 that is laminated on an upper surface of the resin substrate 101. The shield layer 102 has a three layer structure including an adhesion film 102a that is deposited on the resin substrate 101, a conductive film 102b that is deposited on the adhesion film 102a, and a protective film 102c that is deposited on the conductive film 102b. Here, the conductive film 102b may be made of any one of Cu, Ag, and Al. The adhesion film 102a is made of SUS having an adhesive strength to the resin substrate 101 that is higher than that to the conductive film 102b. The protective film 102c that is deposited on the conductive film 102b is made of SUS having an anti-corrosiveness that is higher than that of the conductive film 102b. By forming the shield layer 102 so as to have a three layer structure in this way, for example, the adhesive strength and the anti-corrosiveness are increased.

Patent Document 1: Japanese Unexamined Patent Application Publication No. 2007-243122 (refer to paragraphs 0019 to 0026, FIG. 1, etc.)

BRIEF SUMMARY OF THE DISCLOSURE

The aforementioned shield layer 102 is formed by using a thin-film formation technique, such as a sputtering method or a vapor deposition method. In this case, in general, films are deposited by disposing a principal surface of the resin substrate 101 so as to face a target or a vapor deposition source. Therefore, in a structure in which a component mounted on a wiring board is covered by a mold resin and a shield layer is formed so as to cover a surface of the mold resin, the films are deposited with a top surface of the mold resin facing the target or the vapor deposition source.

According to such a deposition method, the thickness of the shield layer is such that a portion thereof that covers the top surface of the mold resin is thicker than a portion thereof that covers a peripheral side surface of the mold resin. Therefore, when, in order to obtain the desired shield characteristics, a side of a peripheral side surface of the shield layer is to be made thick, the thickness of a side of the top surface becomes larger than necessary. This is an obstacle to reducing the height of a high-frequency module.

The present disclosure is made in view of the above-described problems, and an object thereof is to provide a high-frequency module that can be reduced in height while ensuring shield characteristics.

To this end, a high-frequency module of the present disclosure includes a wiring board, a first component that is mounted on a first principal surface of the wiring board, a first sealing resin layer that is laminated on the first principal surface of the wiring board and that seals the first component, and shield layers that are laminated on the first sealing resin layer. The shield layers include a first shield layer that is laminated on the first sealing resin layer so as to cover an opposite surface of the first sealing resin layer and a peripheral side surface of the first sealing resin layer, the opposite surface being opposite to the first principal surface of the wiring board; and a second shield layer that is laminated on a portion of the first shield layer that covers the peripheral side surface of the first sealing resin layer.

In this case, the peripheral side surface of the first sealing resin layer is covered by the first shield layer and the second shield layer. Therefore, even if the first shield layer cannot be made thick enough for obtaining the desired shield characteristics, the second shield layer can provide a thickness corresponding to the insufficient thickness. Since the second shield layer is not laminated on a side of the opposite surface of the first sealing resin layer opposite to the first principal surface of the wiring board, the opposite surface of the first sealing resin layer is covered by the first shield layer. According to this structure, the height of the high-frequency module can be reduced while ensuring the desired shield characteristics.

The first shield layer may include a first conductive film made of a metal, and the second shield layer may include a second conductive film made of a metal that is the same as that of the first conductive film. In this case, since the difference between the thermal expansion coefficient of the first shield layer and the thermal expansion coefficient of the second shield layer can be made small, it is possible to reduce the peeling between the two shield layers when a heat shock occurs. When the two shield layers are formed by, for example, a sputtering method or a vapor deposition method, a target or a vapor deposition source may be made common, so that it is possible to reduce the cost of forming the two shield layers.

The first shield layer may include a first conductive film made of a metal; the second shield layer may include a third conductive film made of a metal that differs from that of the first conductive film; and one of the metal of the first conductive film and the metal of the third conductive film that differs from that of the first conductive film may have a relative permeability that is greater than or equal to 1. In this case, for example, it is possible to use, for example, copper or aluminum having high conductivity for the metal used for forming the first conductive film, and to use, for example, Ni or Co having high permeability for the metal used for forming the second conductive film. According to this structure, it is possible to improve shield characteristics of the second shield layer to not only an electric field but also a magnetic field.

The high-frequency module may further include a second component that is mounted on a second principal surface of the wiring board, and a second sealing resin layer that is laminated on the second principal surface of the wiring board and that seals the second component. Here, the first shield layer may further cover a peripheral side surface of the second sealing resin layer, and, in addition to the portion of the first shield layer that covers the peripheral side surface of the first sealing resin layer, the second shield layer may be provided so as to cover a portion of the first shield layer that covers the peripheral side surface of the second sealing resin layer and an opposite surface of the second sealing resin layer that is opposite to the second principal surface of the wiring board.

In this case, the peripheral side surface of the first sealing resin layer and the peripheral side surface of the second sealing resin layer are covered by the first shield layer and the second shield layer. Even if one of the first shield layer and the second shield layer cannot be made thick enough for obtaining the desired shield characteristics, it is possible to provide a thickness corresponding to the insufficient thickness by the other of the shield layers. In addition, the opposite surface of the first sealing resin layer opposite to the first principal surface of the wiring board and the opposite surface of the second sealing resin layer opposite to the second principal surface of the wiring board are each covered by only one of the first shield layer and the second shield layer. Therefore, it is possible to reduce the height of the high-frequency module while ensuring the shield characteristics on a side of the peripheral side surface of the first sealing resin layer and on a side of the peripheral side surface of the second sealing resin layer.

Of the shield layers, the first shield layer may be exposed at a surface of a portion that covers the opposite surface of the first sealing resin layer. This makes it possible to reduce the height of the high-frequency module.

A high-frequency module includes a wiring board, a first component that is mounted on a first principal surface of the wiring board, a first sealing resin layer that is laminated on the first principal surface of the wiring board and that seals the first component, and a third shield layer that is laminated on the first sealing resin layer so as to cover an opposite surface of the first sealing resin layer and a peripheral side surface of the first sealing resin layer, the opposite surface being opposite to the first principal surface of the wiring board. The third shield layer includes an adhesion film that is laminated on the first sealing resin layer and a conductive film that is laminated on the adhesion film. A ratio of a thickness of the adhesion film on a side of the peripheral side surface to a thickness of the adhesion film on a side of the opposite surface is smaller than a ratio of a thickness of the conductive film on the side of the peripheral side surface to a thickness of the conductive film on the side of the opposite surface.

The conductivity of the conductive film is often higher than that of the adhesion film, in which case the thicker the conductive film, the better the shield characteristics of the third shield layer. According to this structure, when the thickness of the conductive film and the thickness of the adhesion film on the side of the opposite surface of the first sealing resin layer are the same, the thickness of the conductive film on the side of the peripheral side surface of the first sealing resin layer becomes larger than the thickness of the adhesion film on the side of the peripheral side surface of the first sealing resin layer. Therefore, at the third shield layer, it is possible to easily improve the shield characteristics on the side of the peripheral side surface of the first sealing resin layer.

According to the present disclosure, the peripheral side surface of the first sealing resin layer is covered by the first shield layer and the second shield layer. Therefore, even if the first shield layer cannot be made thick enough for obtaining the desired shield characteristics, the second shield layer can provide a thickness corresponding to the insufficient thickness. Since the second shield layer is not laminated on the side of the opposite surface of the first sealing resin layer opposite to the first principal surface of the wiring board, the opposite surface of the first sealing resin layer is covered by the first shield layer. According to this structure, the height of the high-frequency module can be reduced while ensuring the desired shield characteristics.

DETAILED DESCRIPTION OF THE DISCLOSURE

First Embodiment

Figure 1:
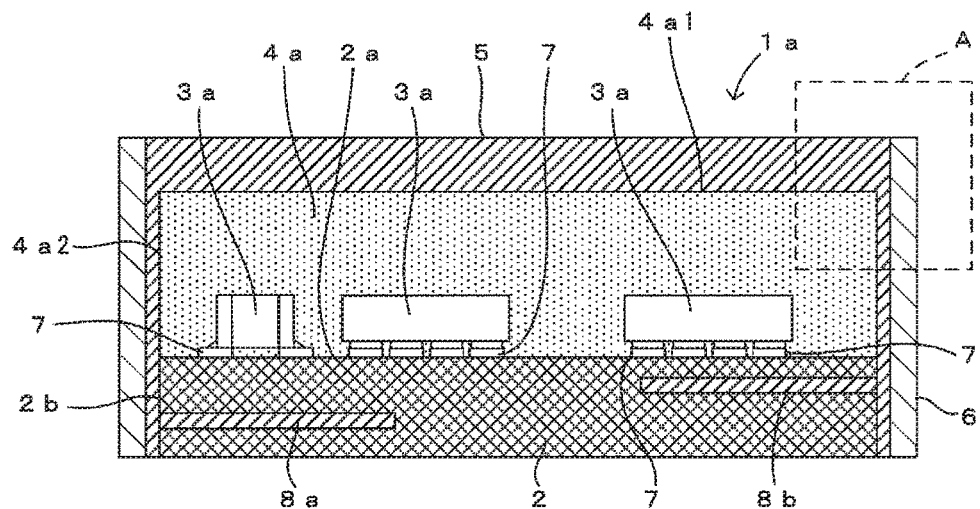
FIG. 1 is a sectional view of a high-frequency module according to a first embodiment of the present disclosure.
Figure 2:
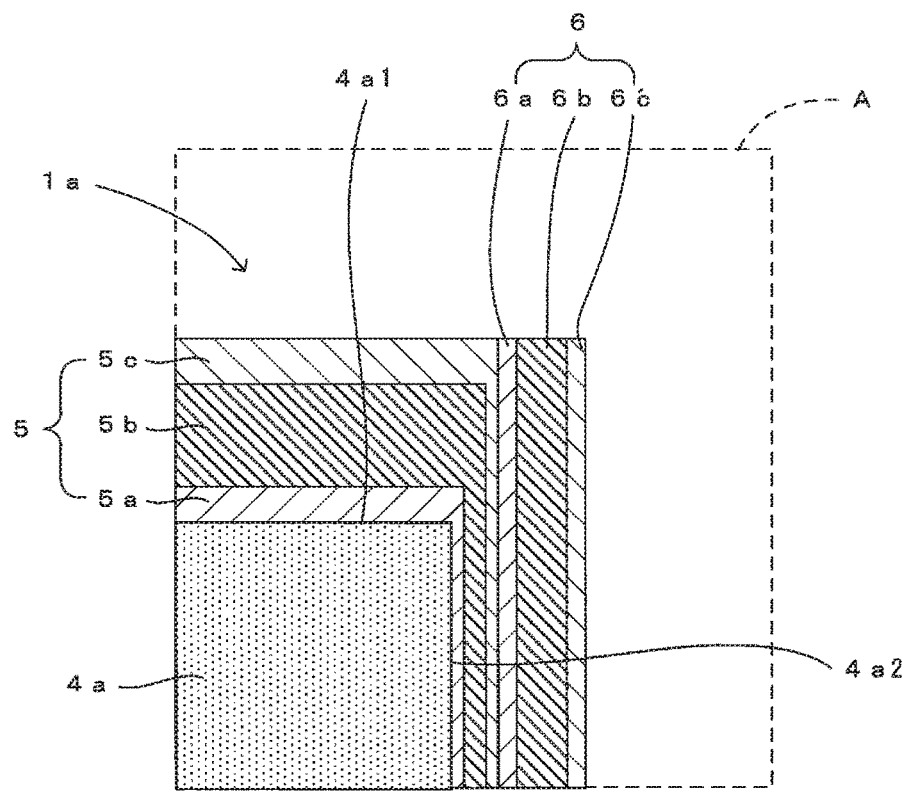
FIG. 2 is an enlarged view of a region A in FIG. 1.

A high-frequency module 1a according to a first embodiment of the present disclosure is described with reference to FIGS. 1 and 2. FIG. 1 is a sectional view of the high-frequency module. FIG. 2 is an enlarged view of a region A in FIG. 1.

As shown in FIG. 1, the high-frequency module 1a according to the embodiment includes a wiring board 2, a plurality of components 3a that are mounted on an upper surface 2a of the wiring board 2, a sealing resin layer 4a that seals each component 3a provided on the upper surface 2a of the wiring board 2, and a first shield layer 5 and a second shield layer 6 (corresponding to "shield layers" of the present disclosure). The high-frequency module 1a is mounted on, for example, a mother board of an electronic device that uses high-frequency signals.

The wiring board 2 is made of, for example, a low temperature co-fired ceramic or a glass epoxy resin. A plurality of land electrodes 7 for mounting the corresponding components 3a thereon are formed on the upper surface (corresponding to a "first principal surface of the wiring board" of the present disclosure). Ground electrodes 8a and 8b, various wiring electrodes (not shown), and a plurality of via conductors (not shown) are formed in the wiring board 2. Here, the ground electrodes 8a and 8b are provided so as to be exposed from a side surface 2b of the wiring board 2.

The land electrodes 7, the ground electrodes 8a and 8b, and the wiring electrodes are each made of a metal that is generally used in wiring electrodes, such as Cu or Al. Each via conductor is made of a metal, such as Ag or Cu. Each land electrode 7 may be plated with Ni/Au.

Examples of each component 3a are a semiconductor device that is made of a semiconductor, such as Si or GaAs, and chip components, such as chip inductors, chip capacitors, and chip resistors. Each component 3a corresponds to a "first component" of the present disclosure.

The sealing resin layer 4a (corresponding to a "first sealing resin layer" of the present disclosure) is provided so as to cover the upper surface 2a of the wiring board 2 and each component 3a. The sealing resin layer 4a may be made of a resin that is generally used as a sealing resin, such as epoxy resin.

The first shield layer 5 is laminated on the sealing resin layer 4a so as to cover an opposite surface 4a1 and a peripheral side surface 4a2 of the sealing resin layer 4a, the opposite surface 4a1 being opposite to the upper surface 2a of the wiring board 2, and the side surface 2b of the wiring board 2. As shown in FIG. 2, the first shield layer 5 has a multilayer structure including an adhesion film 5a that is laminated on the surfaces of the sealing resin layer 4a, a conductive film 5b (corresponding to a "first conductive film" of the present disclosure) that is laminated on the adhesion film 5a, and a protective film 5c that is laminated on the conductive film 5b. The first shield layer 5 is electrically connected to the ground electrodes 8a and 8b exposed at the side surface 2b of the wiring board 2.

The adhesion film 5a is provided for increasing the adhesive strength between the conductive film 5b and the sealing resin layer 4a, and may be made of any one of the following metals, such as SUS, Ti, Cr, Ni, TiCr, TiAl, NiAl, CrAl, and CrNiAl. At the side surface 2b of the wiring board 2, the adhesion film 5a is electrically connected to the ground electrodes 8a and 8b exposed at the side surface 2b. The film thickness of the adhesion film 5a at the opposite surface 4a1 of the sealing resin layer 4a is desirably in a range of 0.01 μm to 0.5 μm. In this embodiment, the adhesion film 5a is made of SUS.

The conductive film 5b is a layer substantially providing a shield function of the first shield layer 5, and may be made of any one of the following metals, such as Cu, Ag, and Al. The film thickness of the conductive film 5b above the opposite surface 4a1 of the sealing resin layer 4a is desirably in a range of 3 μm to 10 μm. In the embodiment, the conductive film 5b is made of Cu. When the thickness of the conductive film 5b is greater than or equal to 3 μm, the conductive film 5b can effectively prevent the noise coming from above the high-frequency module 1a from influencing each component 3a. When the thickness of the conductive film 5b is less than or equal to 10 μm, it is possible to reduce the height of the high-frequency module 1a.

The protective film 5c is provided for preventing the conductive film 5b from being corroded and damaged, and may be made of any one of the following metals, SUS, Ti, Cr, Ni, TiCr, TiAl, NiAl, CrAl, and CrNiAl. The film thickness of the protective film 5c above the opposite surface 4a1 of the sealing resin layer 4a is desirably in a range of 0.03 μm to 1.5 μm. In this embodiment, the protective film 5c is made of SUS.

The second shield layer 6 is provided for reinforcing the first shield layer 5. The second shield layer 6 is laminated on the first shield layer 5 so as to cover a portion of the first shield layer 5 that covers the peripheral side surface 4a2 of the sealing resin layer 4a. As shown in FIG. 2, as with the first shield layer 5, the second shield layer 6 has a multilayer structure including an adhesion film 6a that is laminated on a portion of the protective film 5c that covers the peripheral side surface 4a2 of the sealing resin layer 4a, a conductive film 6b (corresponding to a "second conductive film" of the present disclosure) that is laminated on the adhesion film 6a, and a protective film 6c that is laminated on the conductive film 6b.

As shown in FIG. 2, the second shield layer 6 is provided so as to cover a peripheral side surface of the first shield layer 5 (the protective film 5c), and does not cover an upper surface of the first shield layer 5 (the protective film 5c). Therefore, of the shield layers (the first shield layer 5 and the second shield layer 6), the first shield layer 5 is exposed at a portion that is situated at the opposite surface 4a1 of the sealing resin layer 4a.

The adhesion film 6a of the second shield layer 6 may be formed so as to have the same constitution as the adhesion film 5a of the first shield layer 5. The conductive film 6b of the second shield layer 6 may be formed so as to have the same constitution as the conductive film 5b of the first shield layer 5. The protective film 6c of the second shield layer 6 may be formed so as to have the same constitution as the protective film 5c of the first shield layer 5.

(Method of Manufacturing High-Frequency Module)

Next, a method of manufacturing the high-frequency module 1a is described. In this embodiment, a method of manufacturing the high-frequency-modulela in which the first shield layer 5 and the second shield layer 6 are formed by using a sputtering device is described as an example.

First, each component 3a is mounted on the upper surface 2a of the wiring board 2 made of, for example, a low temperature co-fired ceramic (LTCC) or a glass epoxy resin. Electrodes, such as the land electrodes 7, the ground electrodes 8a and 8b, and the via conductors are formed at the wiring board 2 by using a well-known method. Each component 3a can be mounted by using a general surface mount technology, such as solder mounting. Each component 3a that has been mounted may be subjected to flux cleaning.

Next, the sealing resin layer 4a is formed by sealing each component 3a with epoxy resin; and a mold structure including the wiring board 2, the components 3a mounted on the upper surface 2a of the wiring board 2, and the sealing resin layer 4a laminated on the upper surface 2a of the wiring board 2 so as to cover the upper surface 2a of the wiring board 2 and each component 3a is prepared. The sealing resin layer 4a may be formed by, for example, a coating method, a printing method, a transfer molding method, or a compression molding method.

In order to make uniform the height of the high-frequency module 1a, after forming the sealing resin layer 4a, the opposite surface 4a1 of the sealing resin layer 4a opposite to the upper surface 2a of the wiring board 2 may be subjected to a grinding operation. In order to increase the adhesiveness between the sealing resin layer 4a and the wiring board 2, dry cleaning, such as plasma etching, may be performed before forming the sealing resin layer 4a. When a release film is used in sealing each component 3a with resin such as in the transfer molding method and the compression molding method, the release film may be one having a roughened resin contact surface. In this case, since the surface of the sealing resin layer 4a is uneven, for example, grease on the hands is unlikely to adhere to the surface of the sealing resin layer 4a, and appearance-related problems such as the occurrence of small scratches and dirt are unlikely to become noticeable. A surface roughness Ra of the sealing resin layer 4a in this case is desirably in a range of 1 μm to 10 μm.

Next, when the high-frequency module 1a is to be manufactured by using a collective board from which a plurality of the wiring boards 2 that are integrally formed are to be taken, after forming the sealing resin layer 4a, individual mold structures are separated by using, for example, a dicer, a laser, or a router. In this case, the collective board may be cut in half. When the collective board is cut in half, the first shield layer 5 and the second shield layer 6 can be deposited with the collective board being provided, so that work efficiency is good. When the collective board is cut, the ground electrodes 8a and 8b formed on the wiring board 2 are exposed at the side surface 2b of the wiring board 2.

Next, the separated mold structures are place side by side on and supported by a sputtering tray. In this case, in order to prevent a film formed by sputtering from moving around to a lower surface of the wiring board 2, a paste or tape may be applied to the lower surface of the wiring board 2.

Next, the tray on which each mold structure has been set is disposed in a predetermined position in a chamber of the sputtering device to perform vacuum drawing in the chamber. At this time, the tray is disposed such that the opposite surface 4a1 of the sealing resin layer 4a and each target of the sputtering device face each other. In terms of film quality, it is desirable that an ultimate vacuum degree be low. However, when the ultimate vacuum degree is low, the required vacuum-drawing time is increased. Therefore, in terms of productivity, a set ultimate vacuum degree is desirably in a range of $1 \times 10^{-3}$ Pa to $1 \times 10^{-1}$ Pa. In order to reduce the required vacuum-drawing time, the inside of the chamber may be formed as a sputtering chamber or a load lock chamber (the so-called front chamber). Examples of the sputtering device which may be used include an in-line type, a batch type, and a single-wafer type.

Next, prior to sputtering, dry etching is performed on the surface of each mold structure as required. In this case, a voltage is applied to an Ar ion gun for a required time, and the surfaces (the opposite surface 4a1 and the peripheral side surface 4a2) of the sealing resin layer 4a and the side surface 2b of the wiring board 2 are subjected to dry cleaning by using Ar ions. When this is done, in addition to being possible to remove undesired substances that cause a reduction in the adhesive force between the first shield layer 5 and the sealing resin layer 4a, the adhesiveness between the sealing resin layer 4a and the first shield layer 5 (the adhesion film 5a) is increased due to an anchor effect resulting from the roughening of the surface of each mold structure.

Next, the adhesion film 5a of the first shield layer 5 is deposited by sputtering so as to cover the surfaces of the sealing resin layer 4a and the side surface 2b of the wiring board 2. In this case, as the material of each target, any one of the following metals, SUS, Ti, Cr, Ni, TiCr, TiAl, NiAl, CrAl, and CrNiAl may be used. For example, when the adhesion film 5a is to be made of SUS, a voltage is applied to each SUS target for a desired time to perform the sputtering. The film thickness at this time (the film thickness of a portion of the adhesion film 5a that is positioned at the opposite surface 4a1 of the sealing resin layer 4a) is, for example, in a range of 0.01 μm to 0.5 As a gas that is introduced into the chamber, Ar gas, which is a plasma source, is used. The amount of the gas that is introduced at this time is, for example, in a range of 30 to 300 sccm.

In order to remove oxides from the surface of each target, pre-sputtering (the so-called sputtering with a shutter closed) may be performed. As each target, for example, a sintered target may be used in addition to a metal target. Although it is difficult to form a metal target out of an alloy composition, a sintered target can have its metal composition ratio adjusted in terms of any composition, so that the adhesiveness and anti-corrosiveness can be easily optimized.

Examples of electric power systems of the sputtering device include a DC system, a pulse system, and an RF system. When the pulse system or the RF system is used, even if the resistance value is increased due to the deposition of reactants (oxides, nitrides) on a target surface, electric discharge can be stably performed.

Next, in the same way the adhesion film 5a is formed, the conductive film 5b is deposited on the surface of the adhesion film 5a by sputtering. In this case, as the material of each target, any one of the following metals, Cu, Ag, and Al may be used. For example, when the conductive film 5b is to be made of Cu, a voltage is applied to a Cu target for a desired time to perform sputtering. As a gas that is introduced into the chamber, Ar gas, which is a plasma source, is used. The amount of the gas that is introduced at this time is, for example, in a range of 30 to 300 sccm. As with the adhesion film 5a, pre-sputtering may be performed on the Cu target.

When the tray is disposed such that the opposite surface 4a1 of the sealing resin layer 4a faces each target, the film thickness of a portion of the conductive film 5b at the peripheral side surface 4a2 of the sealing resin layer 4a is approximately 30% of the film thickness thereof above the opposite surface 4a1. When the film thickness of the conductive film 5b is in a range of 3 μm to 10 μm above the opposite surface 4a1 of the sealing resin layer 4a, the film thickness of the portion of the conductive film 5b at the peripheral side surface 4a2 of the sealing resin layer 4a is in a range of 0.9 μm to 3 which is approximately 30% of the film thickness above the opposite surface 4a1. In order to obtain sufficient shield effect, in general, the thickness of the conductive film 5b needs to be at least twice a penetration depth δ of a high frequency wave. Therefore, when the conductive film 5b is made of Cu, the thickness of the conductive film 5b needs to be approximately 2.7 μm in a 2.4 GHz band and approximately 1.8 μm in a 5 GHz band.

For example, when the film thickness of the conductive film 5b above the opposite surface 4a1 of the sealing resin layer 4a is 3 μm, the film thickness of the conductive film 5b at the peripheral side surface 4a2 is approximately 0.9 μm. If, in this structure, a signal in the 2.4 GHz band is to be intercepted, a sufficient shield function can be obtained when the film thickness of the conductive film 5b above the opposite surface 4a1 of the sealing resin layer 4a is 3 μm. In contrast, when the film thickness of the conductive film 5b at the peripheral side surface 4a2 of the sealing resin layer 4a is approximately 0.9 μm, the film thickness is approximately 2 μm less than the film thickness for ensuring a sufficient shield function. Therefore, in the embodiment, the second shield layer 6 is formed to provide a thickness corresponding to the insufficient thickness.

Next, in the same way the adhesion film 5a is formed, the protective film 5c is deposited on the surfaces of the conductive film 5b by sputtering, so that the first shield layer 5 is completed. In this case, as the material of each target, any one of the following metals, SUS, Ti, Cr, Ni, TiCr, TiAl, NiAl, CrAl, and CrNiAl may be used. The film thickness of the protective film 5c at this time (the film thickness of a portion of the protective film 5c that is positioned above the opposite surface 4a1 of the sealing resin layer 4a) is in a range of 0.03 μm to 1.5 μm.

As with the conductive film 5b, the film thickness of the adhesion film 5a and the film thickness of the protective film 5c at the peripheral side surface 4a2 of the sealing resin layer 4a are approximately 30% of the film thickness of the adhesion film 5a and the film thickness of the protective film 5c at the opposite surface 4a1 of the sealing resin layer 4a. Therefore, the film thickness of a portion of the adhesion film 5a at the peripheral side surface 4a2 of the sealing resin layer 4a is, for example, in a range of 0.003 μm to 0.15 μm; and the film thickness of a portion of the protective film 5c at the peripheral side surface 4a2 of the sealing resin layer 4a is, for example, in a range of 0.009 μm to 0.45 μm.

SUS, Ti, Cr, Ni, TiCr, TiAl, NiAl, CrAl, and CrNiAl, which are metals used for the adhesion film 5a, each has a specific resistance that is higher than that of the metal (Cu, Ag, Al) used for the conductive film 5b. Therefore, as the film thickness of the adhesion film 5a increases, the connection resistance between the conductive film 5b and the ground electrodes 8a and 8b is increased. As a result, the shield characteristics of the first shield layer 5 are deteriorated. The conductive film 5b is a film substantially providing a shield function. The thicker the film thickness of the conductive film 5b is, the better the shield characteristics of the first shield layer 5 is. In view of such circumstances, the thicknesses of the adhesion film 5a, the conductive film 5b, and the protective film 5c of the first shield layer 5 are such that desirably the conductive film 5b is the thickest, and the adhesion film 5a is the thinnest.

Next, with a portion of the first shield layer 5 that covers the opposite surface 4a1 of the sealing resin layer 4a being provided with a mask by using, for example, a tape or a paste, the adhesion film 6a of the second shield layer 6 is deposited in the same way as the adhesion film 5a of the first shield layer 5. A metal mask may be used for the mask.

Next, the conductive film 6b of the second shield layer 6 is deposited in the same way as the conductive film 5b of the first shield layer 5. The film thickness of the conductive film 6b at this time is desirably greater than or equal to the insufficient amount of the film thickness of the conductive film 5b of the first shield layer 5 (the film thickness on the side of the peripheral side surface 4a2 of the sealing resin layer 4a).

Next, the protective film 6c of the second shield layer 6 is deposited in the same way as the protective film 5c of the first shield layer 5. Thereafter, the tray is taken out from the sputtering device and the mask is removed, so that the high-frequency module 1a is completed.

The adhesion film 6a, the conductive film 6b, and the protective film 6c of the second shield layer 6 are desirably made of metals that are the same as those of the adhesion film 5a, the conductive film 5b, and the protective film 5c of the first shield layer 5. In this case, the target of the first shield layer 5 and the target of the second shield layer 6 can be made common, so that the manufacturing cost of the high-frequency module 1a can be reduced. In addition, when the first shield layer 5 and the second shield layer 6 have the same structure, since the difference between the thermal expansion coefficient of the first shield layer 5 and the thermal expansion coefficient of the second shield layer 6 can be made small, it is possible to reduce the peeling between the two shield layers when a heat shock occurs.

In addition to being formed by a sputtering device, the first shield layer 5 and the second shield layer 6 may be formed by using a vacuum vapor deposition device.

Therefore, according to the above-described embodiment, the peripheral side surface 4a2 of the sealing resin layer 4a is covered by the first shield layer 5 and the second shield layer 6. Therefore, even if the first shield layer 5 cannot be made thick enough for acquiring the desired shield characteristics, the second shield layer 6 can provide a thickness corresponding to the insufficient thickness. Since the second shield layer 6 is not laminated on the side of the opposite surface 4a1 of the sealing resin layer 4a opposite to the upper surface 2a of the wiring board 2, the opposite surface 4a1 of the sealing resin layer 4a is only covered by the first shield layer 5. According to this structure, the height of the high-frequency module 1a can be reduced while ensuring the desired shield characteristics.

Second Embodiment

Figure 3:
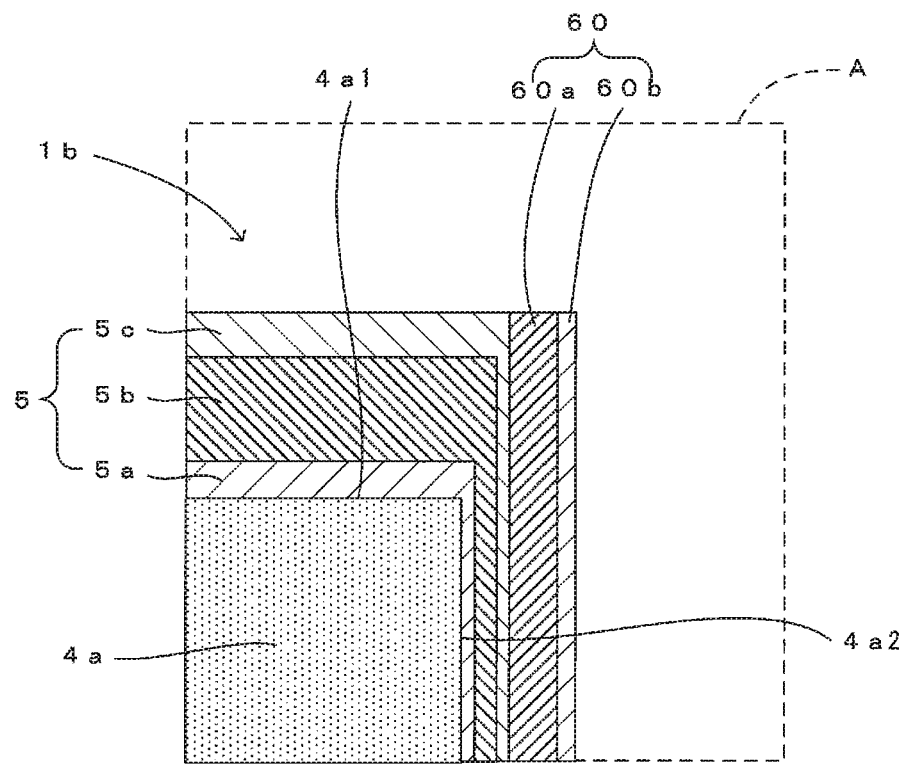
FIG. 3 is a partial sectional view of a high-frequency module according to a second embodiment of the present disclosure.

A high-frequency module according to a second embodiment of the present disclosure is described with reference to FIG. 3. FIG. 3 is a partial sectional view of the high-frequency module, and corresponds to FIG. 2.

The high-frequency module 1b according to the embodiment differs from the high-frequency module 1a of the first embodiment described with reference to FIGS. 1 and 2 in the structure of a second shield layer 60 as shown in FIG. 3. The other structures are the same as those of the high-frequency module 1a of the first embodiment, and are thus given the same reference numerals and are not described.

In this case, the second shield layer 60 includes a magnetic-body film 60a (corresponding to a "third conductive film" of the present disclosure) that is laminated on a portion of a first shield layer 5 that covers a peripheral side surface 4a2 of a sealing resin layer 4a, and a protective film 60b that is laminated on the magnetic-body film 60a. The magnetic-body film 60a is formed from a metal magnetic body having a relative permeability that is higher than that of a conductive film 5b of the first shield layer 5. For example, relative permeabilities $\mu_s$ of metals of which the conductive film 5b of the first shield layer 5 may be made are 0.999991 for Cu, 0.9998 for Ag, and 1.00002 for Al. In contrast, the magnetic-body film 60a of the second shield layer 60 may be made of any one of the following metals, such as Ni having a relative permeability $\mu_s$ of 100 to 600, a permalloy having a relative permeability $\mu_s$ of 8000, and Fe having a relative permeability $\mu_s$ of 5000. For example, when the conductive film 5b of the first shield layer 5 is made of Cu, the magnetic-body film 60a of the second shield layer 60 is made of a metal having a relative permeability that is higher than that of Cu (for example, a relative permeability $\mu_s \geq 1$).

For example, the protective film 60b may have the same constitution as the protective film 5c of the first shield layer 5; for example, the protective film 60b may be made of SUS.

The conductive film 5b of the first shield layer 5 may be formed from a metal magnetic body, such as an Ni magnetic body, a permalloy magnetic body, or an Fe magnetic body; and a portion of the magnetic-body film 60a of the second shield layer 60 may be made of a metal having high conductivity, such as Cu, Ag, or Al. That is, the conductive film 5b of the first shield layer 5 may have the composition of the magnetic-body film 60a of the second shield layer 60, and vice versa. In the first embodiment, the adhesion film 6a, the conductive film 6b, and the protective film 6c of the second shield layer 6 may each be formed from a metal magnetic body, such as an Ni magnetic body, a permalloy magnetic body, or an Fe magnetic body.

According to this structure, since the peripheral side surface 4a2 of the sealing resin layer 4a is covered by the conductive film 5b that is made of, for example, Cu having a high conductivity and by the magnetic-body film 60a having a high relative permeability, it is possible to increase the shield performance with respect to a magnetic field on the side of the peripheral side surface 4a2 of the sealing resin layer 4a. According to such a structure, in order to obtain the desired shield characteristics on the side of the peripheral side surface 4a2 of the sealing resin layer 4a, compared to the structure of the first embodiment, the total film thickness of the first shield layer 5 and the second shield layer 60 can be reduced. Therefore, the height of the high-frequency module 1b is reduced, and the thickness of the first shield layer 5 and the thickness of the second shield layer 60 on the side of the peripheral side surface 4a2 of the sealing resin layer 4a can be reduced, so that the high-frequency module 1b can be reduced in size accordingly.

Third Embodiment

Figure 4:
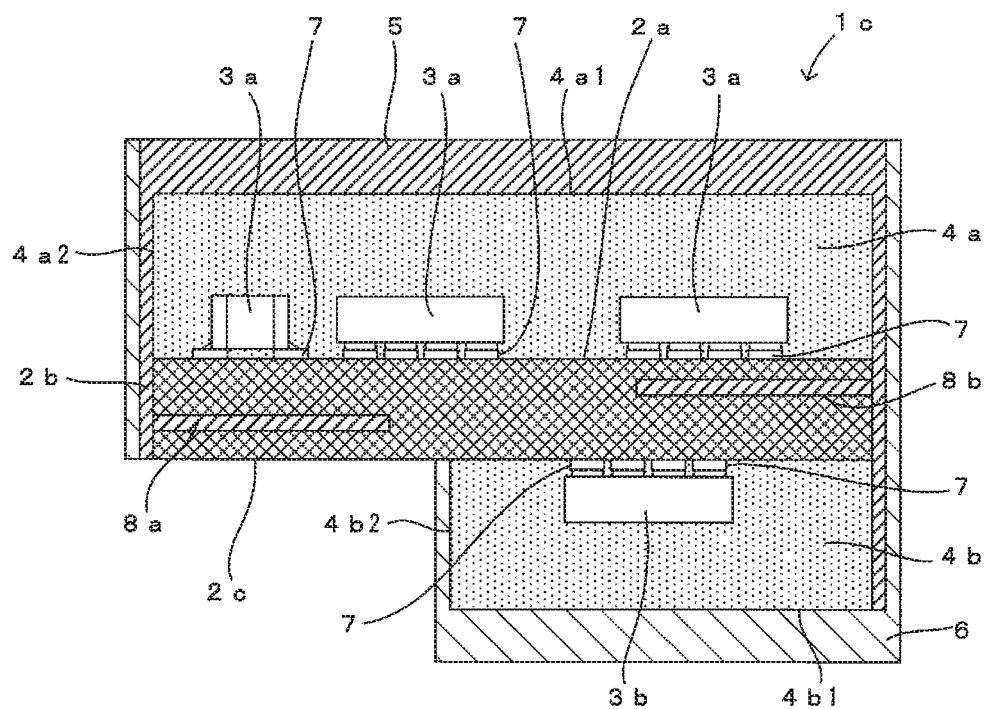
FIG. 4 is a sectional view of a high-frequency module according to a third embodiment of the present disclosure.

A high-frequency module according to a third embodiment of the present disclosure is described with reference to FIG. 4. FIG. 4 is a sectional view of the high-frequency module.

The high-frequency module 1c according to this embodiment differs from the high-frequency module 1a of the first embodiment described with reference to FIGS. 1 and 2 in that, as shown in FIG. 4, a component 3b is mounted on a lower surface 2c of a wiring board 2 (corresponding to a "second principal surface of the wiring board" of the present disclosure), the component 3b is covered with a sealing resin layer 4b, and a first shield layer 5 and a second shield layer 6 also cover the sealing resin layer 4b on a side of the lower surface 2c of the wiring board 2. The other structures are the same as those of the high-frequency module 1a of the first embodiment, and are thus given the same reference numerals and are not described.

As with each component 3a on a side of an upper surface 2a of the wiring board 2, the component 3b (corresponding to a "second component" of the present disclosure) may be formed from a semiconductor device that is made of a semiconductor material, such as Si or GaAs, or a chip component such as a chip inductor, a chip capacitor, or a chip resistor.

The sealing resin layer 4b (corresponding to a "second sealing resin layer" of the present disclosure, and may hereunder be called a "second sealing resin layer 4b") is provided so as to cover the lower surface 2c of the wiring board 2 and the component 3b. Unlike a sealing resin layer 4a (may hereunder be called a "first sealing resin layer 4a") that covers an entire upper surface 2a of the wiring board 2, the sealing resin layer 4b covers a part of the lower surface 2c of the wiring board 2, and, in the embodiment, a portion of the wiring board 2 that is not covered by the second sealing resin layer 4b is used as a space for external connection of the high-frequency module 1c. Here, the second sealing resin layer 4b may cover the entire lower surface 2c of the wiring board 2, and the first sealing resin layer 4a may partly cover the upper surface 2a of the wiring board 2. As with the first sealing resin layer 4a, the second sealing resin layer 4b may be made of a resin that is generally used as a sealing resin, such as epoxy resin.

As shown in FIG. 4, in addition to an opposite surface 4a1 and a peripheral side surface 4a2 of the first sealing resin layer 4a, the first shield layer 5 covers a part of a peripheral side surface 4b2 of the second sealing resin layer 4b. In addition to a portion of the first shield layer 5 that covers the peripheral side surface 4a2 of the first sealing resin layer 4a and a portion of the first shield layer 5 that covers a side surface 2b of the wiring board 2, the second shield layer 6 covers an opposite surface 4b1 of the second sealing resin layer 4b opposite to the lower surface 2c of the wiring board 2 and a portion of the peripheral side surface 4b2 of the second sealing layer 4b that is not covered by the first shield layer 5. The other structures of the first shield layer 5 and the second shield layer 6 are the same as those of the first embodiment.

(Method of Manufacturing High-Frequency Module)

Next, a method of manufacturing the high-frequency module 1c is described while focusing on the differences between it and the method of manufacturing the high-frequency module 1a of the first embodiment.

First, the components 3a are mounted on the upper surface 2a of the wiring board 2a and the component 3b is mounted on the lower surface 2c of the wiring board 2; and the components 3a on the surface 2a of the wiring board 2 are subjected to molding by using the first sealing resin layer 4a and the component 3b on the surface 2c of the wiring board 2 is subjected to molding by using the second sealing resin layer 4b, so that a mold structure is formed. At this time, the first sealing resin layer 4a is molded on the entire upper surface 2a of the wiring board 2, and the second sealing resin layer 4b is partly molded on the lower surface 2c of the wiring board 2 excluding a region of the lower surface 2c on which the component 3b is not mounted. The first the sealing resin layer 4a and the second sealing resin layer 4b may be formed by, for example, a coating method, a printing method, a transfer molding method, or a compression molding method. A side of the first sealing resin layer 4a that covers the entire upper surface 2a of the wiring board 2 may be formed by a coating method or a compression molding method, and a side of the second sealing resin layer 4b that partly covers the lower surface 2c of the wiring board 2 may be formed by a transfer molding method.

The method of forming the first shield layer 5 is the same as that used in forming the high-frequency module 1a of the first embodiment. When a tray is disposed such that the opposite surface 4a1 of the first sealing resin layer 4a and each target of a sputtering device face each other, a part of the peripheral side surface 4b2 of the second sealing resin layer 4b is also covered by an adhesion film 5a, a conductive film 5b, and a protective film 5c of the first shield layer 5.

When the deposition of the first shield layer 5 is completed, the tray is taken out from the sputtering device, and the mold structure is turned upside down and set on the tray. A portion of the lower surface 2c of the wiring board 2 where the second shield film 6 does not need to be deposited is previously provided with a mask by using a tape or a paste. Then, the tray is disposed again in the sputtering device, and an adhesion film 6a, a conductive film 6b, and a protective film 6c of the second shield layer 6 are deposited in the same way as for the first shield layer 5. At this time, the tray is disposed such that the opposite surface 4b1 of the second sealing resin layer 4b and each target face each other.

When this is done, the second shield layer 6 covers the portion of the first shield layer 5 that covers the peripheral surface 4a2 of the first sealing resin layer 4a, the portion of the first shield layer 5 that covers the side surface 2b of the wiring board 2, the opposite surface 4b1 of the second sealing resin layer 4b that is opposite to the lower surface 2c of the wiring board 2, and the portion of the peripheral side surface 4b2 of the second sealing resin layer 4b that is not covered by the first shield layer 5. In other words, by turning the mold structure upside down and performing the deposition twice, the side surfaces of the mold structure (the peripheral side surface 4a2 of the first sealing resin layer 4a and the peripheral side surface 4b2 of the second sealing resin layer 4b, and the side surface 2b of the wiring board 2) are covered by both of the first shield layer 5 and the second shield layer 6.

According to this structure, the side of the opposite surface 4a1 of the first sealing resin layer 4a and the side of the opposite surface 4b1 of the second sealing resin layer 4a have film thicknesses that are greater than those of the side of the peripheral side surface 4a2 of the first sealing resin layer 4a and the side of the peripheral side surface 4b2 of the second sealing resin layer 4a, and are covered by one of the first shield layer 5 and the second shield layer 6. In contrast, the side of the peripheral side surface 4a2 of the first sealing resin layer 4a and the side of the peripheral side surface 4b2 of the second sealing resin layer 4b have film thicknesses that are smaller, and are covered by both the first shield layer 5 and the second shield layer 6. Therefore, the height of the high-frequency module 1c can be reduced while ensuring the shield characteristics on the side of the peripheral side surface 4a2 of the first sealing resin layer 4a and the side of the peripheral side surface 4b2 of the second sealing resin layer 4b.

Fourth Embodiment

Figure 5:
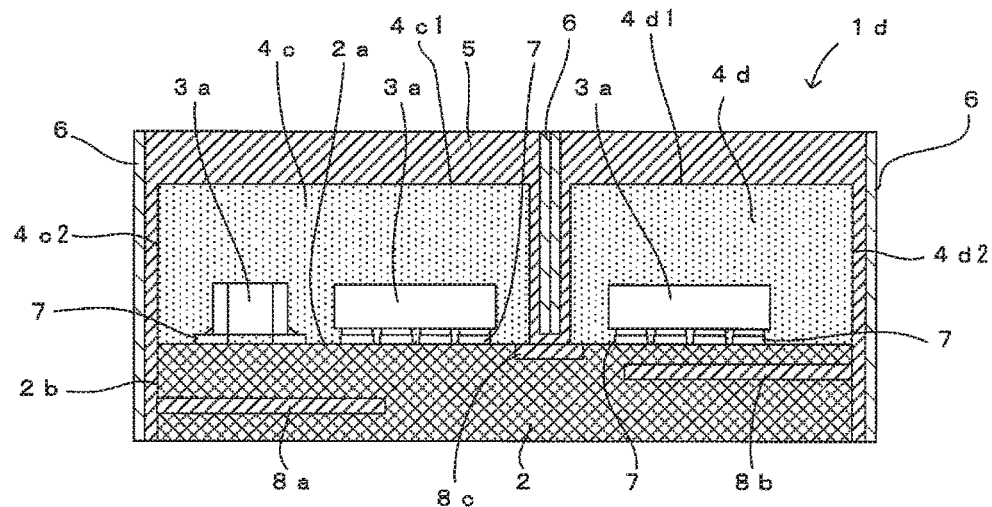
FIG. 5 is a sectional view of a high-frequency module according to a fourth embodiment of the present disclosure.

A high-frequency module according to a fourth embodiment of the present disclosure is described with reference to FIG. 5. FIG. 5 is a sectional view of the high-frequency module.

The high-frequency module 1d according to the embodiment differs from the high-frequency module 1a of the first embodiment described with reference to FIGS. 1 and 2 in that, as shown in FIG. 5, components 3a are separately subjected to molding by using two different sealing resin layers 4c and 4d, the two sealing resin layers 4c and 4d are each individually covered by a first shield layer 5 and a second shield layer 6, and a ground electrode 8c is provided at a wiring board 2. The other structures are the same as those of the high-frequency module 1a of the first embodiment, and are thus given the same reference numerals and are not described.

In this case, the first shield layers 5 covers an opposite surface 4c1 of the sealing resin layer 4c that is opposite to an upper surface 2a of the wiring board 2, a peripheral side surface 4c2 of the sealing resin layer 4c, an opposite surface 4d1 of the sealing resin layer 4d that is opposite to the upper surface 2a of the wiring board, a peripheral side surface 4d2 of the sealing resin layer 4d, and a side surface 2b of the wiring board 2.

The second shield layer 6 is laminated on the first shield layer 5 so as to cover a portion of the first shield layer 5 that covers the peripheral side surface 4c2 of the sealing resin layer 4c, a portion of the first shield layer 5 that covers the peripheral side surface 4d2 of the sealing resin layer 4d, and a portion of the first shield layer 5 that covers the side surface 2b of the wiring board 2. In this case, the first shield layer 5 and the second shield layer 6 are interposed between the two sealing resin layers 4c and 4d. A portion of the first shield layer 5 that is positioned between the two sealing resin layers 4c and 4d is connected to the ground electrode 8c formed at the wiring board 2. Here, the sealing resin layers 4c and 4d each correspond to a "first sealing resin layer" of the present disclosure.

In such a structure, as in the first embodiment, after collectively sealing each component 3a with resin, grooves are formed between predetermined components 3a by using a laser or a dicer. Thereafter, by using the same method as that used to form the high-frequency module 1a of the first embodiment, the first shield layer 5 and the second shield layer 6 can be formed by deposition.

In addition to providing the effects obtained by the high-frequency module 1a of the first embodiment, this structure can prevent mutual noise interference between the components 3a that are sealed by the sealing resin layer 4c and the component 3a that is sealed by the sealing resin layer 4d because the first shield layer 5 and the second shield layer 6 are interposed between the two sealing resin layers 4c and 4d.

Fifth Embodiment

Figure 6:
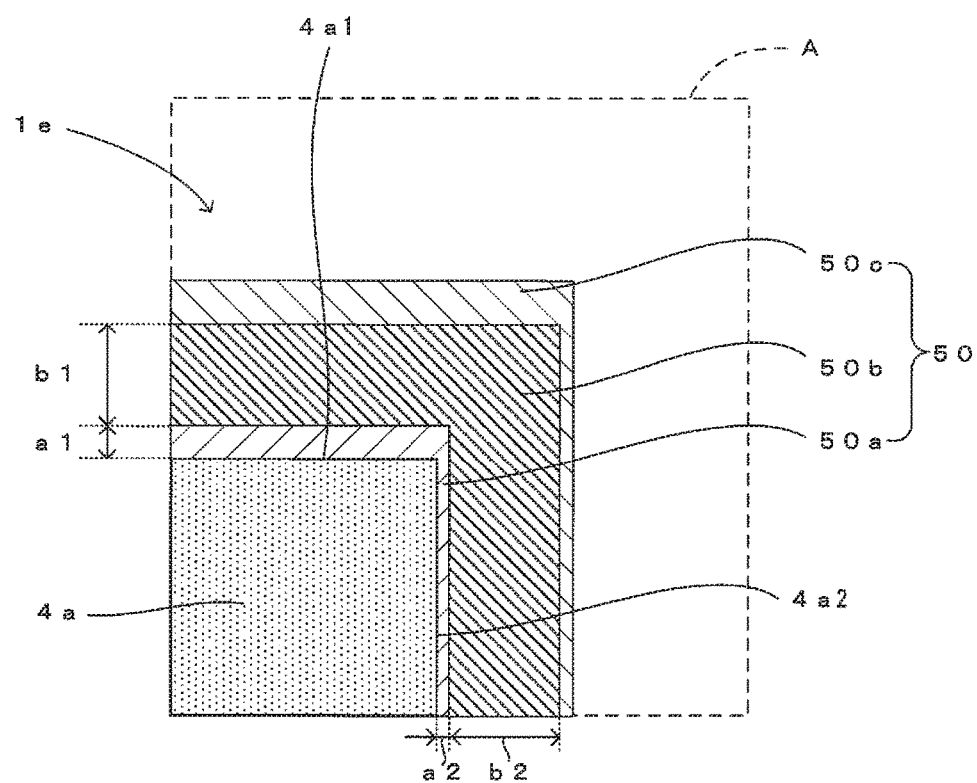
FIG. 6 is a partial sectional view of a high-frequency module according to a fifth embodiment of the present disclosure.
Figure 7:
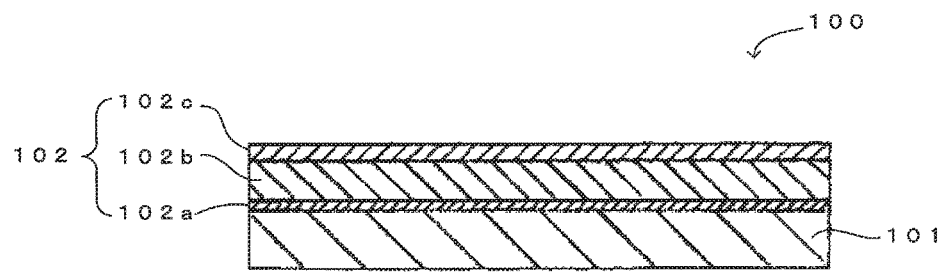
FIG. 7 illustrates an existing shield layer.

A high-frequency module according to a fifth embodiment of the present disclosure is described with reference to FIG. 6. FIG. 6 is a partial sectional view of the high-frequency module, and corresponds to FIG. 2.

The high-frequency module 1e according to this embodiment differs from the high-frequency module 1a of the first embodiment described with reference to FIGS. 1 and 2 in that it includes a third shield layer 50 as shown in FIG. 6. The other structures are the same as those of the high-frequency module 1a of the first embodiment, and are thus given the same reference numerals and are not described.

The third shield layer 50 has a three-layer structure that is substantially the same as that of the first shield layer 5 of the first embodiment. More specifically, as shown in FIG. 6, the third shield layer 50 includes an adhesion film 50a that is laminated on a sealing resin layer 4a so as to cover an opposite surface 4a1 and a peripheral side surface 4a2 of the sealing resin layer 4a, and so as to cover a side surface 2b of a wiring board 2; a conductive film 50b that is laminated on the adhesion film 50a; and a protective film 50c that is laminated on the conductive film 50b. The adhesion film 50a, the conductive film 50b, and the protective film 50c of the third shield layer 50 have the same constitutions as those of the adhesion film 5a, the conductive film 5b, and the protective film 5c of the first shield layer 5.

In the third shield layer 50, the ratio of a thickness a2 of the adhesion film 50a on a side of the peripheral side surface 4a2 of the sealing resin layer 4a to a thickness a1 of the adhesion film 50a on a side of the opposite surface 4a1 of the sealing resin layer 4a is smaller than the ratio of a thickness b2 of the conductive film 50b on the side of the peripheral side surface 4a2 of the sealing resin layer 4a to a thickness b1 of the conductive film 50b on the side of the opposite surface 4a1 of the sealing resin layer 4a ((a2/a1)<(b2/b1)).

The third shield layer 50 may be formed, for example, as follows. The process up to the deposition of the adhesion film 50a is the same as that for the high-frequency module 1a of the first embodiment, and the conductive film 50b is first deposited in the same way as the conductive film 5b of the first shield layer 5 of the first embodiment. Thereafter, a tray is taken out from a sputtering device, and a portion of the conductive film 5b that covers the opposite surface 4a1 of the sealing resin layer 4a is provided with a mask, and the conductive film 50b is deposited for the second time in the same way. This makes it possible to increase the film thickness of only a portion of the conductive film 50b that covers the peripheral side surface 4a2 of the sealing resin layer 4a. Then, the mask is removed, and the protective film 50c is deposited in the same way as that of the first shield layer 5 of the first embodiment, and a second shield layer 6 is not deposited.

According to this structure, it is possible to provide the same effects as those provided by the high-frequency module 1a of the first embodiment without depositing a second shield layer 6.

The present disclosure is not limited to the above-described embodiments, and various changes other than those described above may be made without departing from the gist thereof. For example, in the first embodiment, the adhesion film 6a of the second shield layer 6 need not be provided.

The present disclosure is applicable to various high-frequency modules including a sealing resin layer that covers a component that is mounted on a wiring board, and a shield layer that is laminated on the sealing resin layer.

1a~1e high-frequency module
2 wiring board
3a component (first component)
3b component (second component)
4a, 4c, 4d sealing resin layer (first sealing resin layer)
4b sealing resin layer (second sealing resin layer)
5 first shield layer
5b conductive film (first conductive film)
6, 60 second shield layer
6b conductive film (second conductive film)
50 third shield layer
60a magnetic-body film (third conductive film)

The invention claimed is:

1. A high-frequency module comprising:
a wiring board;
a first component mounted on a first principal surface of the wiring board;
a first sealing resin layer laminated on the first principal surface of the wiring board and sealing the first component; and
shield layers laminated on the first sealing resin layer, wherein the shield layers include
a first shield layer laminated on the first sealing resin layer so as to cover an opposite surface of the first sealing resin layer and a peripheral side surface of the first sealing resin layer, the opposite surface being opposite to the first principal surface of the wiring board, and
a second shield layer laminated on a portion of the first shield layer that covers the peripheral side surface of the first sealing resin layer;
wherein, of the first and second shield layers, the first shield layer is exposed at a surface of a portion covering the opposite surface of the first sealing resin layer.

2. The high-frequency module according to claim 1, wherein the first shield layer includes a first conductive film made of a metal, and
wherein the second shield layer includes a second conductive film made of a metal, wherein the metal of the second conductive film is the same as the metal of the first conductive film.

3. The high-frequency module according to claim 1, wherein the first shield layer includes a first conductive film made of a metal,
wherein the second shield layer includes a third conductive film made of a metal, wherein the metal of the third conductive film differs from the metal of the first conductive film, and
wherein one of the metal of the first conductive film and the metal of the third conductive film has a relative permeability greater than or equal to 1.

4. The high-frequency module according to claim 1, further comprising:
a second component mounted on a second principal surface of the wiring board; and
a second sealing resin layer laminated on the second principal surface of the wiring board and sealing the second component,
wherein the first shield layer further covers a peripheral side surface of the second sealing resin layer, and
wherein, in addition to the portion of the first shield layer covering the peripheral side surface of the first sealing resin layer, the second shield layer is provided so as to cover a portion of the first shield layer covering the peripheral side surface of the second sealing resin layer and an opposite surface of the second sealing resin layer opposite to the second principal surface of the wiring board.

5. The high-frequency module according to claim 2, further comprising:
a second component mounted on a second principal surface of the wiring board; and
a second sealing resin layer laminated on the second principal surface of the wiring board and sealing the second component,
wherein the first shield layer further covers a peripheral side surface of the second sealing resin layer, and
wherein, in addition to the portion of the first shield layer covering the peripheral side surface of the first sealing resin layer, the second shield layer is provided so as to cover a portion of the first shield layer covering the peripheral side surface of the second sealing resin layer and an opposite surface of the second sealing resin layer opposite to the second principal surface of the wiring board.

6. The high-frequency module according to claim 3, further comprising:
a second component mounted on a second principal surface of the wiring board; and
a second sealing resin layer laminated on the second principal surface of the wiring board and sealing the second component,
wherein the first shield layer further covers a peripheral side surface of the second sealing resin layer, and
wherein, in addition to the portion of the first shield layer covering the peripheral side surface of the first sealing resin layer, the second shield layer is provided so as to cover a portion of the first shield layer covering the peripheral side surface of the second sealing resin layer and an opposite surface of the second sealing resin layer opposite to the second principal surface of the wiring board.

7. A high-frequency module comprising:
a wiring board;
a first component mounted on a first principal surface of the wiring board;
a first sealing resin layer laminated on the first principal surface of the wiring board and sealing the first component; and
a third shield layer laminated on the first sealing resin layer so as to cover an opposite surface of the first sealing resin layer and a peripheral side surface of the first sealing resin layer, the opposite surface being opposite to the first principal surface of the wiring board,
wherein the third shield layer includes an adhesion film laminated on the first sealing resin layer and a conductive film laminated on the adhesion film, and
wherein a ratio of a thickness of the adhesion film on a side of the peripheral side surface to a thickness of the adhesion film on a side of the opposite surface is smaller than a ratio of a thickness of the conductive film on the side of the peripheral side surface to a thickness of the conductive film on the side of the opposite surface.

* * * * *

UNITED STATES PATENT AND TRADEMARK OFFICE
CERTIFICATE OF CORRECTION

PATENT NO. : 10,455,748 B2
APPLICATION NO. : 15/817481
DATED : October 22, 2019
INVENTOR(S) : Issei Yamamoto Page 1 of 1

It is certified that error appears in the above-identified patent and that said Letters Patent is hereby corrected as shown below:

In the Specification

Column 8, Line 39, "6" should be -- $\delta$ --.

Signed and Sealed this
Eighteenth Day of February, 2020

Andrei Iancu
*Director of the United States Patent and Trademark Office*